United States Patent [19]

Freller et al.

[11] 4,400,254

[45] Aug. 23, 1983

[54] METHOD FOR PREPARING TRANSPARENT, ELECTRICALLY CONDUCTING INDIUM OXIDE ($IN_2O_3$) FILMS

[75] Inventors: Helmut Freller, Röthenbach; Peter Schack, Nuremberg, both of Fed. Rep. of Germany

[73] Assignee: Siemens Aktiengesellschaft, Berlin & Munich, Fed. Rep. of Germany

[21] Appl. No.: 339,865

[22] Filed: Jan. 18, 1982

Related U.S. Application Data

[63] Continuation of Ser. No. 168,244, Jul. 10, 1980, abandoned.

[30] Foreign Application Priority Data

Jul. 26, 1979 [DE] Fed. Rep. of Germany ....... 2930373

[51] Int. Cl.$^3$ ............................................. C23C 15/00
[52] U.S. Cl. .................................................. 204/192 P
[58] Field of Search .................................... 204/192 P

[56] References Cited

U.S. PATENT DOCUMENTS 4,010,291 3/1977 Katsube et al. ..................... 427/126

OTHER PUBLICATIONS

W. Molzen, "Characterization of Transparent Conductive Films of Indium Oxide", *J. Vac. Sci. Technol.*, vol. 12, pp. 98–102 (1975).

K. Itoyama, "Properties of Sn–Doped Indium Oxide Coatings Deposited on Polyester Film by High Rate Reactive Sputtering", *J. Electrochem. Soc.*, vol. 126, pp. 691–694 (1979).

*Primary Examiner*—Aaron Weisstuch
*Attorney, Agent, or Firm*—Kenyon and Kenyon

[57] ABSTRACT

Indium-tin alloy targets are high-frequency cathode sputtered using water vapor with a pressure of between $10^{-3}$ mbar and $5 \times 10^{-3}$ mbar as the reaction gas. The temperature-sensitive substrates used are water-cooled during the deposition.

3 Claims, 1 Drawing Figure

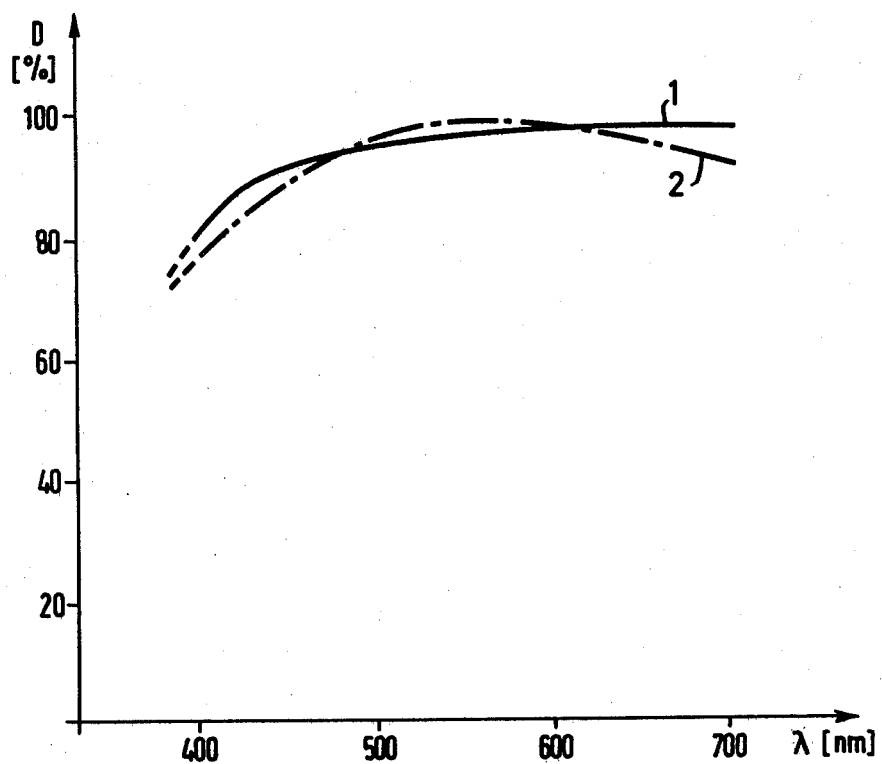

METHOD FOR PREPARING TRANSPARENT, ELECTRICALLY CONDUCTING INDIUM OXIDE (IN$_2$O$_3$) FILMS

This is a continuation of application Ser. No. 168,244 filed July 10, 1980, now abandoned.

BACKGROUND OF THE INVENTION

The present invention relates to a method for preparing transparent, electrically conducting indium oxide (In$_2$O$_3$) films on temperature sensitive substrates by high-frequency cathode sputtering of indium-tin alloy targets in a vacuum, using a reaction gas.

All methods and substances used to date for the preparation of such electrically conducting films, such as tin-doped indium oxide (In$_2$O$_3$: Sn), antimony-doped tin oxide (SnO$_2$: Sb) and cadmium stannate (Cd$_2$SnO$_4$) require, either during the preparation or in subsequent processing, the application of a temperature treatment at temperatures between about 200° C. and 700° C. in order to insure the attainment of optimum electrical and optical properties of the films. It does not matter whether an oxygen deficit produced in the preparation through the temperature treatment is to be satisfied or whether an oxygen excess is to be driven out (*J. Vac. Sci. Technol.* 15 (4), July/Aug. 1978, pages 1565 to 1567).

For certain applications, for example, if film substrates which are not thermally stable, such as plastic foils or optical fibers, are used or if the application of the film is to be made on top of thermally unstable layers already deposited in a previous operation, heating during the deposition process or a subsequent temperature treatment is undesirable.

To date, for example, very thin, partially transparent metal films of gold have been used as substrates. However, the light absorption of gold is very high (about 50% at a thickness of 10 nm) and the low mechanical hardness and the poor adhesion of these layers are also disadvantageous.

Additionally, in the attempts thus far to precipitate oxide semiconductor layers on cold substrates, either optimum optical transparency or optimum conductivity, depending on the intended application, had to be sacrificed (Appl. Phys. 16, pgs. 239 to 246 (1978); Japanese Journal of Applied Physics Vol. 17, No. 7, July 1938, pgs. 1191 to 1196).

While it has been possible to deposit conducting transparent films of In$_2$O$_3$ on water-cooled polyester foils or glass by high-frequency ion plating in argon-oxygen mixtures, the values for the resistivity obtained, with $\rho = 8 \times 10^{-3}$ ohm.cm, are still about 40-times higher than those which are known for the same layers with thermal post-treatment.

SUMMARY OF THE INVENTION

It is an object of the present invention to develop a method by which it is possible to prepare transparent, electrically conducting oxide layers of indium oxide without the need for any temperature treatment, so that thermally unstable substrates also can be employed.

According to the invention, this and other objects are achieved by the provision that water vapor with a pressure in the range of from $10^{-3}$ mbar to $5 \times 10^{-3}$ mbar is used as a reaction gas in the high-frequency cathode sputtering of indium/tin alloy targets, and that the temperature-sensitive substrates used in the process are water-cooled during the deposition.

It has been found to be particularly advantageous to use water vapor with a pressure of $3 \times 10^{-3}$ mbar. Temperature-sensitive substrates which may be employed according to the present invention include, for example, polyester foils, optical fibers or glass with thermally unstable layers such as WO$_3$.

The invention is based on the discovery that either layers with an oxygen deficit or with an oxygen surplus are produced with cathodic sputtering of tin-doped In$_2$O$_3$ films in oxygen or in oxygen-argon mixtures, depending on the magnitude of the oxygen pressure or content. While the layers with an oxygen deficit, in particular, have poor optical properties, good optical transmission is achieved in the case of layers with an oxygen surplus. However, in these latter layers, only moderate conductivity, depending on the magnitude of the oxygen excess, is achieved. The transition between these two layer modifications takes place in a narrowly limited pressure range, such that films with optimum properties could not be obtained reproducibly during the preparation process without additional heating.

According to the invention, water vapor is therefore used as a reaction gas which, while on the one hand furnishing oxygen for the oxidation of the atomized indium particles during its decomposition in the high-frequency plasma, on the other hand also simultaneously liberates a reducing component which prevents excessive oxidation of the target and of the film being produced.

DETAILED DESCRIPTION OF THE INVENTION

The invention will be explained in further detail with the aid of the drawing and an illustrative, non-limiting example.

Highly transparent films having a film resistivity of 6 to $8 \times 10^{-4}$ ohm.cm were obtained through high-frequency cathode sputtering of In:Sn alloy targets, with the composition 80% by weight In and 20% by weight Sn, using water vapor as the reaction gas with an operating pressure of $3 \times 10^{-3}$ mbar. The glass plates and optical fibers used as temperature-sensitive substrates were water-cooled during the deposition. With film thicknesses of 150 nm, area resistivities of 50 ohms/square were obtained without post-treatment. These film properties closely approach the properties of post-tempered film.

In FIG. 1, the optical transmission in the visible wavelength range is plotted for an In$_2$O$_3$ film sputtered-on in water vapor and for In$_2$O$_3$ film which was sputtered-on in an oxygen atmosphere and was subsequently post-tempered at 500° C. in nitrogen-hydrogen (in the ratio of 90:10). Both films had an area resistivity of approximately 20 ohms/square. The light wavelength $\lambda$ in nm is shown on the abscissa and, on the ordinate, the light transmission D in percent. From the shape of the curves 1 and 2 it can be seen that the film sputtered-on in water vapor according to curve 1 is, despite its greater film thickness (d = 335 nm), equivalent as to transmission to the film sputtered-on in an oxygen atmosphere according to curve 2, with a film thickness d = 120 nm.

What is claimed is:

1. In a method for preparing transparent, electrically conducting tin-doped indium oxide (In$_2$O$_3$) layers on temperature-sensitive substrates through high-frequency cathode sputtering of indium/tin alloy targets in a vacuum, using a reaction gas, the improvement comprising utilizing water vapor having a pressure in the range of from $3 \times 10^{-3}$ mbar to $5 \times 10^{-3}$ mbar as the reaction gas, and water-cooling the temperature-sensitive substrates during the deposition.

2. The method according to claim 1, wherein said water vapor has a pressure of $3 \times 10^{-3}$ mbar.

3. The method according to claim 2, wherein said temperature-sensitive substrate is selected from the group consisting of polyester foil, optical fibers and glass with thermally unstable layers.

* * * * *